(12) United States Patent
Konno et al.

(10) Patent No.: US 7,648,730 B2
(45) Date of Patent: Jan. 19, 2010

(54) PASTE FOR SOLAR CELL ELECTRODE AND SOLAR CELL

(75) Inventors: Takuya Konno, Tochigi-ken (JP); Takashi Kitagaki, Utsunomiya (JP); Hiroki Kojo, Tochigi (JP)

(73) Assignee: E.I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 12/162,509

(22) PCT Filed: Aug. 1, 2006

(86) PCT No.: PCT/US2006/029942

§ 371 (c)(1), (2), (4) Date: Jul. 29, 2008

(87) PCT Pub. No.: WO2007/089273

PCT Pub. Date: Aug. 9, 2007

(65) Prior Publication Data

US 2009/0001328 A1   Jan. 1, 2009

(30) Foreign Application Priority Data

Feb. 2, 2006    (JP) ............................ 2006-026340

(51) Int. Cl.
*B05D 5/12* (2006.01)
*H01B 1/22* (2006.01)

(52) U.S. Cl. ..................................... 427/96.1; 252/514
(58) Field of Classification Search ................. 252/514; 427/96.1, 99.2, 125
See application file for complete search history.

(56) References Cited

U.S. PATENT DOCUMENTS

| 5,766,516 A * | 6/1998 | Fukuta et al. ............... 252/514 |
| 6,406,646 B1 * | 6/2002 | Lee et al. ..................... 252/514 |
| 6,556,419 B2 * | 4/2003 | Suzuki et al. ............... 361/303 |
| 6,815,073 B2 * | 11/2004 | Tanei et al. .................. 428/434 |
| 2006/0107791 A1 * | 5/2006 | Fujino et al. .................. 75/365 |
| 2007/0181858 A1 * | 8/2007 | Matsushima et al. ........ 252/500 |
| 2008/0035895 A1 * | 2/2008 | Ogi et al. ..................... 252/514 |

FOREIGN PATENT DOCUMENTS

JP    2003/257243 A    9/2003
WO    WO 2006/008896 A1    1/2006

OTHER PUBLICATIONS

PCT International Search Report and Written Opinion for International Application No. PCT/US2006/029942 dated Jan. 26, 2007.

* cited by examiner

*Primary Examiner*—Mark Kopec

(57) ABSTRACT

In a paste for a solar cell light-receiving surface electrode including silver particles, glass frit, resin binder, and thinner, silver particles with a specific surface of 0.20-0.60 $m^2/g$ are used as the silver particles. The silver particles are preferably included at 80 mass % or more to the total amount of silver particles being included in the paste.

6 Claims, 1 Drawing Sheet

PASTE FOR SOLAR CELL ELECTRODE AND SOLAR CELL

BACKGROUND OF THE INVENTION

1. Field of the Invention

Figure 1A:
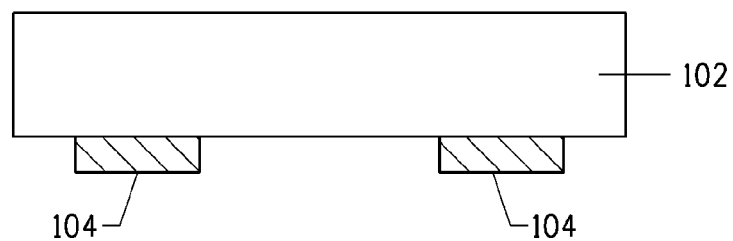
Figure 1B:
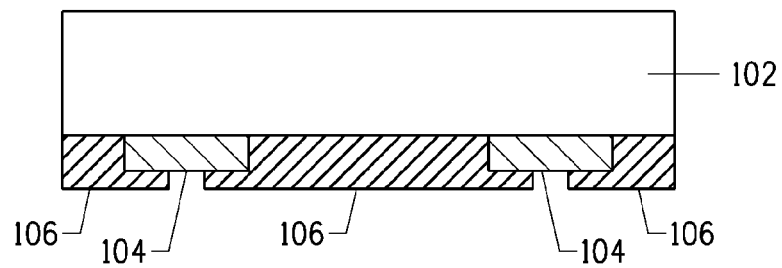

The present invention pertains to a solar cell. More specifically, the present invention pertains to an electrode paste for a solar cell light-receiving surface being used in the manufacture of an electrode in a solar cell and a solar cell being obtained by using said paste.

2. Description of Related Art

In manufacturing an electrode for a solar cell, the electrode is formed at the side in which an anti-reflection film is formed. The generally used method for manufacturing the electrode is a method that spreads a paste containing glass frit, resin binder, thinner, and if necessary, additives on an anti-reflection film and [then] sinters it.

In order to raise the power generation characteristics in the solar cell, the characteristics of the electrode are important. For example, the power generation efficiency is raised by lowering the resistance value of the electrode. In order to achieve this purpose, various methods are proposed.

Silver particles are generally known as the electroconductive metal in the electrode of the solar cell. However, the relationship between the specific surface of the silver particles being used and the power generation characteristics is not deeply reviewed. In paragraph [0009] of Japanese Kokai Patent Application No. 2003-257243, "BET diameter" is defined as "the particle diameter attained, assuming that the particles have a spherical shape, based on the specific surface ($m^2/g$) of the particles measured in the BET method." According to said publication, the BET diameter of the silver particles being used is 0.10-0.50 μm. As application examples and comparative examples, silver powders with a BET diameter of 0.02-0.50 μm are presented.

Here, if the silver density=10.5 $g/cm^3$=10.5×$10^6$ $g/m^3$, the radius=R (μm)=R×$10^{-6}$ m, and the specific surface=S ($m^2/g$), the following equation is established.

$$\text{Weight of one silver particle} = 4\pi(R \times 10^{-6})^2/S = (4\pi(R \times 10^{-6})^3/3) \times 10.5 \times 10^6$$

If this equation is solved with respect to S, $$S = 3/(10.5 \times R).$$

Since the BET diameter is a diameter, the radius R is its half. Considering this, if the specific surface of the silver powder with a BET diameter of 0.02-0.50 μm, it [specific surface] is 1.1-28.6 $m^2/g$.

BET diameter of 0.02 μm=radius of 0.01 μm=specific surface of 28.6 $m^2/g$

BET diameter of 0.10 μm=radius of 0.05 μm=specific surface of 5.7 $m^2/g$

BET diameter of 0.50 μm=radius of 0.25 μm=specific surface of 1.1 $m^2/g$

BRIEF SUMMARY OF THE INVENTION

The purpose of the invention is to provide an electroconductive paste contributing to the improvement of the power generation efficiency of a solar cell.

An embodiment of the present invention is a paste for a solar cell light-receiving surface electrode including silver particles with a specific surface of 0.20-0.60 $m^2/g$, glass frit, resin binder, and thinner. The silver particles are preferably included at 80 mass % or more to the total amount of silver particles being included in an electrode.

An embodiment of the present invention is a solar cell light having an electrode surface that consists of a paste for a solar cell-light receiving surface electrode including silver particles with a specific surface of 0.20-0.60 $m^2/g$, glass frit, resin binder, and thinner. The silver particles, optimally includes 80 mass % or more to the total amount of silver particles being included in the electrode. The solar cell having an electrode prepared using the paste for a solar cell electrode of the present invention has excellent power generation efficiency.

BRIEF DESCRIPTION OF THE DRAWING(S)

FIG. 1 explains the manufacturing processes in manufacturing a solar cell using the electroconductive paste of the present invention.

DETAILED DESCRIPTION OF THE INVENTION

It has been clarified that the power generation characteristics of the solar cell being obtained are improved by using silver particles with a small specific surface as the silver being included as an electroconductive metal in the paste. The present invention is based on this knowledge.

The present invention pertains to a paste for a solar cell light-receiving surface electrode including silver particles with a specific surface of 0.20-0.60 $m^2/g$, glass frit, resin binder, and thinner. The electroconductive paste of the present invention is used in forming a light-receiving surface electrode (surface side electrode) of a solar cell.

Next, each component of the electroconductive paste of the present invention is explained.

1. Electroconductive Metal

In the paste of the present invention, silver (Ag) particles are used as an electroconductive metal. The silver particles of the present invention have a specific surface smaller that of general silver particles. Specifically, the specific surface of the silver particles is 0.20-0.60 $m^2/g$, preferably 0.25-0.50 $m^2/g$. The power generation characteristics tend to be improved with the decrease of the specific surface, however if the specific surface is too small, the adhesive strength is likely to be lowered. With the use of silver particles with a small specific surface, the power generation characteristics of the obtained solar cell are improved.

The specific surface [measured] can be attained by a BET-point method (JIS-Z-8830). An apparatus on the market may used, and for example, it can be measured using NOVA3000 made by Quantachrome Co. In the present invention, if a meaningful difference is made in the specific surface by the measuring apparatus, the value measured by NOVA3000 made by Quantachrome Co. is adopted.

The content of the silver particles is not particularly limited. One or two kinds of silver particles with a specific surface [requirement] that is regulated in the present invention can be used. Sometimes, other silver particles may also be used. In case silver particles which deviate from the specific surface [requirement] that is regulated in the present invention are used, the amount being used is preferably 20 wt % or less [compared] to the total amount of silver particles. In other words, the content of the silver particles that meet the specific surface [requirement] that is regulated in the present invention is 80 mass % or more to the total amount of silver particles being included in the paste. The content is preferably 90 mass % or more, more preferably 95 mass % or more, and especially preferably 100 mass %. The obtained power generation characteristics tend to be improved with the increase of the content of the silver particles with a specific surface [requirement] that is regulated in the present invention.

The silver particles that meet the specific surface [requirement] that is regulated in the present invention can be manufactured by the atomizing method, wet-reducing method, etc. The specific surface can be controlled by controlling the conditions in each manufacturing method. In general, the specific surface can be reduced by setting conditions in which the particle diameter is increased.

It has been considered that it is preferable for the silver particles used in the light-receiving surface of the electrode of the solar cell to be fine and to have a large specific surface. The reason for this is considered to be that fine silver particles with a large specific surface are easily introduced into the depressions and projections of the wafer surface to prevent the reflection. On the other hand, according to these inventors, it was clarified that the power generation characteristics of the solar cell being obtained were improved by using silver particles with a small specific surface. Specifically, the characteristics such as Eff: conversion efficiency (%), Rs: serial resistance ($\Omega \cdot cm^2$), FF: fill factor (%), Voc: open voltage (mV), Jsc: short circuit current ($mA \cdot cm^2$), and Rsh: shunt resistance ($\Omega \cdot cm^2$) are improved. The present invention is based on this knowledge.

The particle diameter and the specific surface of the silver particles have a fixed relation, and if the particle diameter of the silver particles is large, the specific surface tends to be decreased. For this reason, in obtaining the silver particles with a small specific surface of the present invention, the particle diameter is apt to be increased. Also, in case the silver particles are used for a general electroconductive paste, the particle diameter of the silver particles is not particularly limited in terms of technical effects, however the particle diameter has an influence on the sintering characteristics of the silver (for example, the silver particles with a large particle diameter are sintered at a speed slower than that of the silver particles with a small particle diameter). Furthermore, it is necessary for the silver particles to have a particle diameter suitable for a method for spreading an electroconductive paste (for example, screen printing).

In consideration of these requirements, the average particle diameter of the silver particles is preferably 0.1-14 μm, more preferably 2.0-8.0 μm. With the use of the silver particles with such a particle diameter, a paste suitable for spreading of the electroconductive paste can be formed. Also, silver particles with excellent sintering characteristics are easily obtained. For example, the average particle diameter is calculated as an average particle diameter (50% point) by the measured value of LA-920 made by Horiba Seisakusho K.K.

Usually, it is preferable for the silver to have a high purity (99%+). However, a substance with low purity can also be used by an electrical requirement of an electrode pattern.

The content of the silver particles in the paste is not particularly limited, however the content is preferably 70-90 wt % based on the weight of the paste.

2. Glass Frit

It is preferable for the electroconductive paste of the present invention to include a glass frit as an inorganic binder. The glass binder usable in the present invention is a glass frit with a softening point of 450-550° C. so that the electroconductive paste may be sintered at 600-800° C., appropriately wetted, and appropriately adhered to a silicon substrate. If the softening point is lower than 450° C., the sintering is advanced, and the effects of the present invention cannot be sufficiently obtained. If the softening point is higher than 550° C., since a sufficient melting flow is not caused during sintering, a sufficient adhesive strength is not exerted, and the liquid-phase sintering of the silver cannot be accelerated in some cases.

Here, the "softening point" is a softening point obtained by the fiber stretch method (fiber elongation method) of ASTM C338-57.

Since the chemical composition of the glass frit is not important in the present invention, any glass frit being used in electroconductive paste for an electronic material can be used. For example, silver borosilicate glass, etc., can be appropriately used. Silver silicate glass and the lead borosilicate glass are excellent materials in the present invention in terms of both the range of the softening point and the glass fusibility. In addition, a leadless glass such as zinc borosilicate can also be used.

The content of the glass frit is not particularly limited as long as it is an amount that can achieve the purpose of the present invention, however the content is preferably 0.5-10.0 wt %, more preferably 1.0-3.0 wt % based on the weight of the electroconductive paste.

If the amount of glass frit is smaller than 0.5 wt %, the adhesive strength is sometimes not sufficient [sic; sufficient]. If the amount of glass frit is more than 10.0 wt %, a trouble is sometimes caused in the soldering postprocess by glass rise, etc.

3. Resin Binder

The electroconductive paste of the present invention includes a resin binder. In this application example, the "resin binder" is a concept including a mixture of a polymer and a thinner. Therefore, an organic liquid (also called a thinner) may also be included in the resin binder. In the present invention, the resin binder in which organic liquid is included is preferable, and if the viscosity is high, if necessary, the organic liquid can be separately added as a viscosity regulator.

In the present invention, an optional resin binder can be used. In the present invention, a pine oil solution or ethyl cellulose or ethylene glycol monobutyl ether monoacetate solution of resin (polymethacrylate, etc.), terpineol solution of ethyl cellulose, etc., can be mentioned. In the present invention, a terpineol solution of ethyl cellulose (ethyl cellulose content=5-50 wt %) is preferably used. Also, in the present invention, a solvent containing no polymers, such as water or organic liquid, can be used as a viscosity regulator.

As the usable organic liquid, for example, alcohol, ester of alcohol (for example, acetate or propionate), and terpene (for example, pine oil, terpineol, etc.) can be mentioned.

The content of the resin binder is preferably 5-50 wt % based on the weight of the electroconductive paste.

4. Additives

In the electroconductive paste of the present invention, a thickener and/or a stabilizer and/or other general additives may also be added or may not be added. In case the additives are added, tackifier (thickener), stabilizer, etc., can be added. Also, as other general additives, dispersant, viscosity regulator, etc., can be added. The amount of tackifier, etc., being added is changed in accordance with the viscosity of the electroconductive paste, however it can be appropriately determined by the concerned party.

Also, several kinds of additives may be added.

As explained below, it is preferable for the electroconductive paste of the present invention to have a prescribed range of viscosity. In order to render an appropriate viscosity to the electroconductive paste, if necessary, a tackifier (thickener) can be added. As examples of the tackifier, the above-mentioned substances can be mentioned. The amount of tackifier, etc., being added is changed in accordance with the viscosity of the final electroconductive paste and can be appropriately determined by the party concerned.

The electroconductive paste of the present invention is favorably manufactured by mixing each above-mentioned component with a three-roller kneader. The electroconductive paste of the present invention is preferably spread on a desired part of the light-receiving surface of the solar cell by screen printing, however in spreading it in such a printing, it is preferable to have a prescribed range of viscosity. The viscosity of the electroconductive paste of the present invention is preferably 50-300 PaS when it is measured at 10 rpm and 25° C. by a utility cup using a #14 spindle as a Brookfield HBT viscometer.

As mentioned above, the electroconductive paste of the present invention is used to form an electrode mainly composed of silver on the light-receiving surface of the solar cell. In other words, the paste of the present invention is printed and dried on the light-receiving surface of the solar cell. Separately, a back face electrode composed of aluminum or silver is also formed on the back face of the solar cell. These electrodes are preferably simultaneously sintered.

Then, the solar cell of the present invention is explained. The solar cell of the present invention has a light-receiving surface electrode formed of sliver particles with a specific surface of 0.20-0.60 m$^2$/g, glass frit, resin binder, and thinner. Preferably, the silver particles are included at 80 mass % or more [compared] to the total amount of silver particles being included in the electrode. The silver particles and the glass frit are the same as those mentioned above, their explanation is omitted.

An example for preparing the solar cell using the electroconductive paste of the present invention is explained referring to FIG. 1.

First, a Si substrate 102 is prepared. An electroconductive paste 104 for a solder connection is spread on the back face of the substrate by screen printing and dried (FIG. 1(a)). As the electroconductive paste, a conventional silver conductive paste containing silver particles, glass particles, and resin binder can be used. Next, aluminum paste for the back face electrode for the solar cell (there is no particular limitation as long as it is used for the solar cell, however for example, PV333, PV322 (applicant of the patent of this case)) 106, etc., are spread by screen printing, etc., and dried (FIG. 1(b)). The drying temperature of each paste is preferably 180° C. or lower. Also, the film thickness of each electrode of the back face is the thickness after drying, and the thickness is preferably 20-40 μm in the aluminum paste and 15-30 μm in the electroconductive silver paste. Also, the overlapping part of the aluminum paste and the electroconductive silver paste is about 0.5-2.5 mm.

Figure 1C:
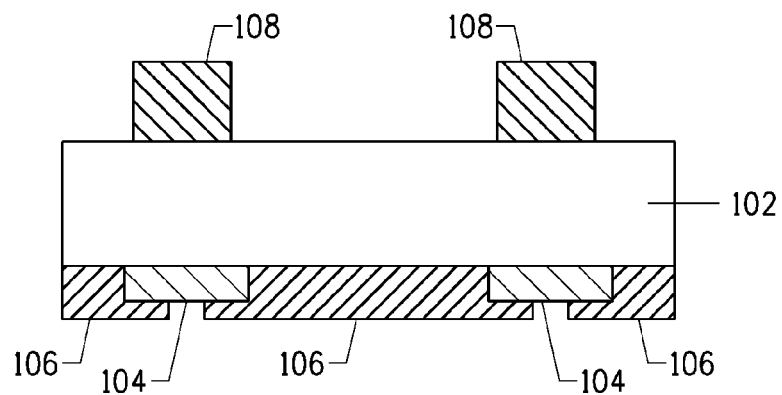

Next, an electroconductive paste 108 of the present invention is spread by screen printing, etc., and dried (FIG. 1(c)). For the substrate obtained, the aluminum paste and the electroconductive silver paste are simultaneously sintered at a temperature of about 600-900° C. for about 2-15 min in an infrared sintering furnace, so that an intended solar cell can be obtained (FIG. 1(d)).

Figure 1D:
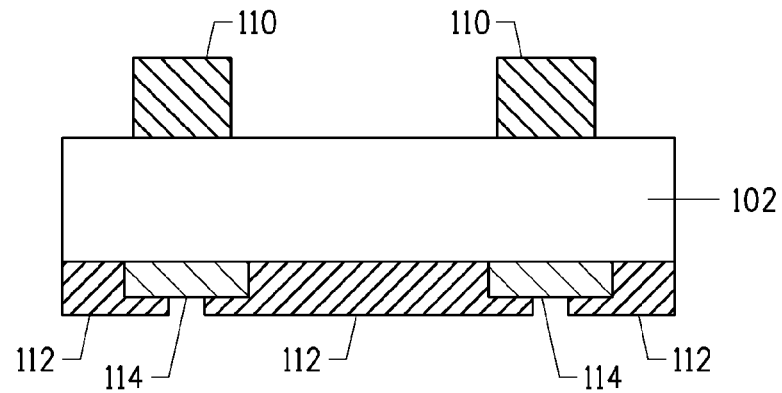

The solar cell being used by using the electroconductive paste of the present invention, as shown in FIG. 1(d), has an electrode 110 formed of the electroconductive paste of the present invention on the light-receiving surface (surface) of the substrate (for example, Si substrate) 102 and has an Al electrode (first electrode) 112 mainly composed of Al and a silver electrode (second electrode) mainly composed of Ag on the back face.

EXAMPLES

1. Preparation of Electroconductive Paste

Application Example 1

A mixture containing silver particles with a specific surface of 0.25 m$^2$/g, Si.B.Pb.O system glass frit, and sintering auxiliary material was prepared. A terpineol solution containing 20% ethyl cellulose was added as an organic vehicle to the mixture. Furthermore, terpineol was added as a thinner to adjust the viscosity. The content of each component is shown in Table I. The silver particles were 83.4 wt %, the glass frit was 1.6 wt %, the organic vehicle was 10.0 wt %, the sintering auxiliary material was 3.5 wt %, and the terpineol added as a thinner to adjust the viscosity was 0.9 wt %.

This mixture was premixed in a universal mixer and kneaded by a three-roll kneader, so that a paste for a solar cell electrode was obtained. The particle diameters, the contents, and the characteristics of the materials used were shown in Table I.

Application Examples 2-4 and Comparative Examples 1-3

Pastes for a solar cell electrode were obtained similarly to Application Example 1 except for changing the kind of silver particles being used and the amount being used to the amounts shown in Table I.

TABLE I

| | | Application Example 1 | Application Example 2 | Application Example 3 | Application Example 4 | Comparative Example 1 | Comparative Example 2 | Comparative Example 3 |
|---|---|---|---|---|---|---|---|---|
| Silver particles A | specific surface ($m^2/g$) | 0.25 | 0.30 | 0.51 | 0.59 | 0.62 | 0.84 | .084 |
| | wt % | 83.4 | 83.4 | 71.0 | 71.0 | 71.0 | 83.4 | 71.0 |
| | wt % vs Ag total | 100.0 | 100.0 | 85.1 | 85.1 | 85.1 | 100.0 | 85.1 |
| Silver particles B | Specific surface ($m^2/g$) | — | — | 1.9 | 1.9 | 1.9 | — | 1.9 |
| | wt % | — | — | 12.4 | 12.4 | 12.4 | — | 12.4 |
| | wt % vs Ag total | — | — | 14.9 | 14.9 | 14.9 | — | 14.9 |
| Glass frit | wt % | 1.6 | 1.6 | 1.6 | 1.6 | 1.6 | 1.6 | 1.6 |
| Organic vehicle | wt % | 10.0 | 10.0 | 10.0 | 10.0 | 10.0 | 10.0 | 10.0 |
| Additive | wt % | 3.5 | 3.5 | 3.5 | 3.5 | 3.5 | 3.5 | 3.5 |
| Thinner | wt % | 0.9 | 0.9 | 0.9 | 0.9 | 0.9 | 0.9 | 0.9 |

3. Preparation of Solar Cell

Using four kinds of obtained pastes, solar cells were manufactured. First, a Si substrate was prepared. An electroconductive paste (silver paste) for a soldering connection was spread on the back face of the Si substrate by screen printing and dried. Next, an aluminum paste (PV333 (made by E.I. du Pont de Nemours and Company)) for a back face electrode was spread in a partially overlapping fashion with the dried silver paste by screen printing and dried. The drying temperature of each paste was set to 120° C. Also, the film thickness of each electrode of the back face being spread [upon] was 35 μm of the aluminum paste and 20 μm of the silver paste as a film thickness after drying.

Furthermore, the paste of the present invention was spread on the light-receiving side surface (surface) by screen printing and dried. A printer made by Price Co., and a mask having an 8 inch and 10 inch frame and a stainless wire with a mesh of 250 were used. A pattern for evaluation for 1.5 in consisting of finger lines with a width of 100 μ and bus bars with a width of 2 mm was employed, and the film thickness was 13 μm after sintering.

Next, for the obtained substrate, the spread pastes were simultaneously sintered under the conditions of a peak temperature of about 730° C. and IN-OUT for about 5 min in an infrared sintering furnace, so that intended solar cells were obtained.

The solar cells being obtained using the electroconductive pastes of the present invention, as shown in FIG. 1, have the Ag electrode 110 on the light-receiving surface (surface) of the substrate 102 (for example, Si substrate) and the Al electrode (first electrode) 112 mainly composed of Al on the back face and the silver electrode (second electrode) 114 mainly composed of Ag.

4. Evaluation of Cells

The electric properties (I-V characteristic) of the solar cell substrates obtained were evaluated by a cell tester. As the cell tester, an equipment (NCT-M-150AA) made by NPC Co., was used.

Eff: conversion efficiency (%) and Rs: serial resistance ($\Omega \cdot cm^2$) were measured. The higher Eff, the more excellent power generation performances as a solar cell. The lower Rs, the more excellent power generation performances as a solar cell. The results are shown in Table II. The numerical values of each electric property shown in Table II are the average of measured values of 5 sheets of solar cell substrate samples and are relative values of the case where each numerical value of Comparative Example 1 was assumed as 1.

TABLE II

| | Application Example 1 | Application Example 2 | Application Example 3 | Application Example 4 | Comparative Example 1 | Comparative Example 2 | Comparative Example 3 |
|---|---|---|---|---|---|---|---|
| Eff | 1.123 | 1.221 | 1.034 | 1.048 | 1 | 0.641 | 0.464 |
| Rs | 0.552 | 0.432 | 0.817 | 0.799 | 1 | 2.492 | 5.611 |

As mentioned above, the characteristics of the obtained solar cells are improved using the silver particles with a small specific surface.

What is claimed is:

1. A method of producing a light receiving surface electrode of a solar cell comprising the steps of:

applying a conductive paste on a silicon substrate; wherein the conductive paste comprises silver particles with a specific surface of 0.20-0.60 m$^2$/g, and wherein the conductive paste further comprises glass frit, resin binder; and thinner and firing the applied conductive paste at a temperature of 600-900 degrees C for 2-15 minutes.

2. The method of claim 1, wherein the above-mentioned silver particles are included at 80 mass % or more of the total amount of silver particles being included in the paste.

3. The method of claim 1 wherein the average particle diameter of the silver particles is 0.1-14 μm.

4. The method of claim 1 wherein the average particle diameter of the silver particles is 2.0-8.0 μm.

5. The method of claim 1 wherein the content of the silver particles in the paste is 70-90% based upon the weight of the paste.

6. The method of claim 1 wherein the content of the glass frit is 0.5-10 wt % based upon the weight of the paste.

* * * * *